United States Patent [19]
Zotov et al.

[11] Patent Number: 5,742,092
[45] Date of Patent: Apr. 21, 1998

[54] SEMICONDUCTOR STRUCTURES, METHODS FOR CONTROLLING THEIR CONDUCTIVITY AND SENSING ELEMENTS BASED ON THESE SEMICONDUCTOR STRUCTURE

[76] Inventors: Vladislav Dmitrievich Zotov, Ulitsa Serpukhovskoi val, 9 kv. 20; Vladimir Nikolaevich Bodrov, Ulitsa Vinnitskaya 13, kv. 84; Elena Petrovna Vinogradova, Ulitsa Bestuzhevykh 7V, kv. 20; Anatoly Trofimovich Serov, Dmitrovskoe Shosse, 13, Korpus 3, kv. 23, all of Moscow, Russian Federation

[21] Appl. No.: 632,771

[22] Filed: Apr. 15, 1996

Related U.S. Application Data

[63] Continuation of Ser. No. 158,050, Nov. 24, 1993, abandoned, which is a continuation of Ser. No. 764,919, filed as PCT/SU89/00340, Nov. 29, 1989, abandoned.

[30] Foreign Application Priority Data

Dec. 29, 1989 [WO] WIPO ............ PCT/SU89/00340

[51] Int. Cl.$^6$ ............ H01L 29/167; H01L 29/207; H01L 29/227
[52] U.S. Cl. ............ 257/610; 257/611
[58] Field of Search ............ 357/64, 27; 257/610, 257/611

[56] References Cited

U.S. PATENT DOCUMENTS

| | | | |
|---|---|---|---|
| 3,443,167 | 5/1969 | Willardson et al. | 257/610 |
| 4,476,481 | 10/1984 | Iesaka et al. | 257/610 |
| 4,695,863 | 9/1987 | Noguier et al. | 257/611 |

FOREIGN PATENT DOCUMENTS 1161831  6/1985  U.S.S.R.

OTHER PUBLICATIONS

Sze, S.M. *Physics of Semiconductor Devices*, John Wiley, 1981, p. 26, p. 21.

Alekseev, M., et al., "Some Properties of a Current Filament in Diode Structures . . . " Soviet Physics–Semiconductors, vol. 3, No. 12 Jun. 1970, pp. 1514–22.

Sultanov, N., et al., "Devices with S– and N–Type Current–voltage Characteristics . . . " Soviet Physics—Semiconductors, vol. 10, No. 9, Sep. 1976, pp. 995–7.

I.M. Vikulin et al "Galvanomagnitnye Pribory", 1983, Radio I Svyaz (Moskow), pp. 39–42.

(List continued on next page.)

*Primary Examiner*—Ngân V. Ngô
*Attorney, Agent, or Firm*—Ladas & Parry

[57] ABSTRACT

A semiconductor structure, in which the concentrations of impurities are in such a ratio that the amount of carriers produced by an impurity of a first type of conductivity compensated by a third impurity is essentially equal to or exceeds by no more than one order of magnitude the amount of carriers produced by an impurity of the second type of conductivity. A method for controlling such a semiconductor structure (1) is provided, in which the value of the current forming a current path or filament (7) is set in a range, in which a periodic variation of the conductivity in the zone of the current filament (7) is produced. The variation leads to a change of the conductivity of the entire semiconductor structure (1) so that a train of pulses is generated at the output of the semiconductor structure (1). When the amount of carriers produced by the impurity of the first type of conductivity compensated by the third impurity exceeds the amount of carriers produced by the impurity of the second type of conductivity, it is necessary to apply an external effect to the structure (1) to produce the variation of conductivity. The frequency of variation of the conductivity in the zone of the current filament can be controlled by applying at least one external effect in the structure.

22 Claims, 3 Drawing Sheets

OTHER PUBLICATIONS

Fizika I Tekhnika Poluprovodnikov, v.8, Issue Jan. 1, 1974 (Nauka, Leningrad), pp. 39–44, N.B. Zaletaev et al, Vliyanie Osveschenia . . . Zolota.

Fizika I Tekhnika Poluprovodnikov, v.12, Issue May 6, 1978 (Nauka, Leningrad), pp. 1187–1188, Magnitochuvstvitelnye . . . IRI Diem.

Fizika I Tekhnika Poluprovodnikov, v.10, Issue Mar. 3, 1976 (Nauka, Leningrad), pp. 511–517, P.T. Oreshkin et al., "Nekotorye . . . Vodnikov".

Fizika I Tekhnika Poluprovodnkikov, v.19, Issue Jul. 7, 1985 (Nauka, Leningrad), pp. 1334–1335, V. Bonskis et al., Neustroichivost . . . Perekhodo.

Fizika I Tekhinka Poluprovodnikov, v.18, Issue May 8 1984 (Nauka, Leningrad), pp. 1383–1385 A.T. Gorelenok et al, Osobennosti . . . Vodnikak.

SEMICONDUCTOR STRUCTURES, METHODS FOR CONTROLLING THEIR CONDUCTIVITY AND SENSING ELEMENTS BASED ON THESE SEMICONDUCTOR STRUCTURE

This application is a continuation of application Ser. No. 08/158,050 filed on Nov. 24, 1993, now abandoned which is a continuation of application Ser. No. 07/764,919, filed as PCT/SU89/00340, Nov. 29, 1989, (now abandoned).

FIELD OF THE INVENTION

This invention relates to semiconductor technology and, more particularly, it relates to semiconductor structures, methods for controlling their conductivity and to sensing elements based on these semiconductor structures.

PRIOR ART

In the application of semiconductor structures, one of the most important objectives is the conversion of input data and the production of a signal functionally associated with the input data. In so doing, the basic problem is to provide simplicity and accuracy of the conversion and generation of an output signal whose level and type are most suitable for subsequent processing.

In the majority of modern semiconductor structures the input signal is converted by controlling the conductivity of these devices.

Known in the art are semiconductor structures, a method for controlling their conductivity by a magnetic field and sensing elements based thereon (G. A. Egiazarian, V. I. Stafeev. Magnetic Transistors and their Application, Moscow. "Radio" Publishers 1987, pp. 12–13).

The known semiconductor structure is made of a high-resistance material having conductivity close to the natural value and consists of a $p^+$-n junction, in which the length of the n-region is several times larger than the length of migration of the carriers.

The method for controlling the conductivity of such a semiconductor structure constituted as a sensing element consists in that the sensing element is connected in the forward direction to a power supply source. Then a magnetic field is applied to the sensing element (external effect). The magnetic field is oriented so that it is normal to the current flowing through the sensing element and the conductivity of the n-zone is controlled. The change of the conductivity of the n-zone reduces the current flowing through the sensing element, this current being used for determining the magnitude of the magnetic field.

However, sensing elements based on such a semiconductor structure have an analog output signal (electric current variation) which, as a rule, has a low amplitude and needs amplification and, when connected to a computer, needs an analog-to-digital converter. Furthermore, the analog output signal has low noise immunity, therefore, the measurement accuracy is low. When the sensing element is spaced from a signal processing device and located in a noisy environment, special noise suppressor have to be used.

Known in the art are semiconductor p-n structures, a method for controlling their conductivity by a light beam and sensing elements based on this system (N. B. Zaletaev, K. M. Kulikov, V. P. Nikiforova, V. I. Stafeev. Luminous Effects on Properties of S-Diodes Made of Germanium with Gold Impurity. In: Semiconductor Physics and Technology, v.8, No. 1, 1974, pp. 39–44).

The sensing element is made of n-type germanium doped with gold and compensated with antimony. The gold concentration $N_{Au}$ is in the following relation with the antimony concentration $N_{Sb}$:

$$N_{Au} < N_{Sb} < 2N_{Au}$$

The n-zone is several times longer than the distance of migration of the carriers.

The sensing elements based on such a semiconductor structure has an S-shaped current-voltage characteristic. The sensing element is connected to a power supply source in the forward direction and is acted on by an external light source. The conductivity of the initial sensing elements is changed under the effect of light and this results in a change of the output signal amplitude. The sensitivity to light is increased due to introduction of the above-mentioned doping materials in a preset proportion and an increase of the n-zone.

However, the output signal of such a sensing element has an analog form and the accurate measurement of the light signal is hindered for the reasons mentioned above.

Also Known in the art is a semiconductor sensing element based on a semiconductor structure with an S-shaped current-voltage characteristic having contacts on its opposite faces, one contact being made in the form of an isosceles triangle with an apex directed inside the structure (SU, A, 1161831).

The method for controlling the conductivity of this semiconductor structure when used in the known sensing element is effected as follows. A voltage exceeding some threshold value is applied to the sensing element thus forming a current path or filament, usually in the central part of the structure opposite the apex of the triangular electrode. Then an external effect (magnetic field) is applied to the sensing element thereby changing the conductivity of the structure. In so doing, the current filament deviates for some distance from its place of origin. This deviation increases the length of the structure in the current direction and this, along with curving the path of the carriers, additionally increases the sensing element resistance so that the structure sensitivity is also increased.

However, such a sensing element produces an analog signal whose measurement is associated with the difficulties mentioned above. Furthermore, manufacture of a triangular contact is technically difficult which complicates the use of such a sensing element in measuring instruments.

The known semiconductor structures closest in technical essence to the proposed semiconductor structures of the invention, methods of controlling their conductivity and sensing elements based on these semiconductor structures is a semiconductor p-n structure made of high-resistance silicon compensated by a power iridium dope (S. A. Azimov, M. S. Yunusov, B. V. Umarov. Magnetically Sensitive Diodes Made of Iridium-Doped Silicon. In: Semiconductor Physics and Technology, v. 12, No. 6, 1978, pp. 1187–1188). The p-n junction in the semiconductor structure is made by fusing a gold impurity with antimony into a silicon plate. In the sensing element based on this semiconductor structure, the contacts are arranged on the opposite sides of the silicon plate. Such semiconductor structures and sensing elements produce an S-shaped current-voltage characteristic. The method for controlling the sensing element based on such a structure consists in the following. The sensing element is connected to a power supply source in the forward direction. A supply voltage is set under which the element transfers to a state with negative differential resistance. A magnetic field (external effect) is applied to the sensing element with an orientation that changes the semiconductor structure conductivity. The magnetic field intensity is determined by measuring the voltage variation on the sensing element.

This structure, the method and sensing element make it possible to obtain an output signal of sufficiently high level which in some cases needs no additional amplification. However, this output signal is analog, therefore, the accuracy and noise immunity of the measurements is low while the signal processing is complicated.

SUMMARY OF THE INVENTION

The basic object of the invention is to develop such semiconductor structures, methods for controlling their conductivity and sensing elements based on these structures, which, due to proper selection between the concentrations of dopes in the semiconductor structure and control of the frequency of variation of their conductivity, allows one to obtain at the output of the sensing elements a frequency-pulse signal of a high amplitude and to develop structurally simple semiconductor converters of various physical quantities, e.g. magnetic field, mechanical force, optical radiation, self-excited generators, d.c. voltage—frequency converters and other devices having high accuracy and reliability of the measurement and conversion.

This object is attained by providing a semiconductor structure made of a material doped with an impurity of one type of conductivity, in which a p-n junction is produced by introducing an impurity of the opposite type of conductivity; the impurity of the first type of conductivity is compensated by introducing a third impurity producing high power levels in the semiconductor structure; according to the invention, the concentration of impurities in the semiconductor structure is in such a ratio that the amount of carriers produced by the impurity of the first type of conductivity compensated by the third impurity is essentially equal to or exceeds by at least one order the amount of carriers produced by the impurity of the second type of conductivity.

The semiconductor structure material is preferably silicon doped with an impurity producing the n-type of conductivity, such as phosphorus, while the impurity producing the p-type conductivity, is, for example, aluminum; the impurity producing the n-type conductivity is preferably compensated by the third impurity producing high power levels, this impurity being gold.

The third impurity may also be zinc.

The ratio of the concentration of the impurities in the semiconductor structure at which the amount of carriers produced by the impurity of the first type of conductivity compensated by the third impurity is essentially equal to the amount of carriers produced by the impurity of the second type of conductivity, provides, under certain conditions, the appearance of periodic variation of the conductivity of the semiconductor structure in the zone of the current filament. When semiconductor devices are based on such a structure a frequency-pulse high-amplitude output signal is generated which has high noise immunity, can be measured with a high accuracy and needs no analog-to-digital converter for interfacing the system with a computer.

The ratio of concentrations of impurities in the semiconductor structure at which the amount of carriers produced by the impurity of the first type of conductivity compensated by the third impurity exceeds by at least one order the amount of carriers produced by the impurity of the second type of conductivity provides the appearance of periodic variation of the conductivity of the current filament under the effect of an external action and control of the frequency of these variations by this or another action. These semiconductor structures have the same advantages as the structures described above.

The semiconductor structure material consisting of silicon doped with a phosphorus impurity producing the n-type conductivity, and a gold or zinc impurity compensating the phosphorus impurity provides semiconductor structures realizing the above advantages.

The object of the invention is also attained by providing a method for controlling the conductivity of a semiconductor structure made of a material doped with an impurity of one type of conductivity, in which a p-n junction is produced by introducing an impurity of the opposite type of conductivity; the impurity of the first type of conductivity is compensated by introducing a third impurity producing high power levels in the structure, in which a current filament is forcefully formed in the semiconductor structure; according to the invention, in the semiconductor structure the concentrations of impurities are in such a ratio at which the amount of carriers produced by the impurity of the first type of conductivity compensated by the third impurity is essentially equal to the amount of carriers produced by the impurity of the second type of conductivity; the value of the current path is set within a range in which the conductivity in the semiconductor structure periodically varies in the zone of the current filament leading to a change in the conductivity of the entire semiconductor structure to obtain a train of pulses at the output of the semiconductor structure.

It is expedient to control the frequency of variation of the conductivity in the current filament zone using at least one external effect.

Furthermore, the object of the invention is attained by providing a method for controlling the conductivity of a semiconductor structure made of a material doped with a mixture of one type of conductivity in which a p-n junction is produced by introducing an impurity of the opposite type of conductivity; the impurity of the first type of conductivity is compensated by introducing a third impurity producing high power levels in the structure, in which in the semiconductor structure there is forcefully formed a current path and an external effect is applied to the semiconductor structure; according to the invention, in the semiconductor structure there is provided a concentration of impurities in such a ratio that the amount of carriers produced by the impurity of the first type of conductivity compensated by the third impurity exceeds by at least one order the amount of carriers produced by the impurity of the second type of conductivity; the value of the current needed to form the current path is set in a range in which the semiconductor structure acted on by an external signal is subjected to periodic variation of the conductivity in the current filament zone leading to a change of the conductivity of the entire semiconductor structure so that at the output of the semiconductor structure there is produced a train of pulses whose repetition frequency depends on the magnitude of the external effect.

The current range, in which the structure is subjected to periodic variation of the conductivity in the current filament zone is preferably selected depending on the concentrations of all types of impurities, geometric size and design parameters of the semiconductor structure.

The external effect may be a magnetic field oriented normally to the current filament in the structure.

The external effect may also be a mechanical force applied to the semiconductor structure in the current filament zone.

In some cases it is preferable to use an external effect in the form of optical radiation directed to the current filament zone.

When using a semiconductor structure having a concentration of impurities in such a ratio that the amount of carriers produced by the impurity of the first type of conductivity compensated by the third impurity is essentially equal to the amount of carriers produced by the impurity of the second type of conductivity, thermal effects are preferably used as said external effect.

It is also expedient that, when using a semiconductor structure having a concentration of impurities in such a ratio that the amount of carriers produced by the impurity of the first type of conductivity exceeds by at least one order the amount of carriers produced by the impurity of the second type of conductivity, at least two external effects are used, the external effect of one type being periodic variation of the conductivity in the current filament zone and the external effect of the second type controlling the frequency of this variation.

The two types of the external effects may include a magnetic field, a mechanical force and optical radiation.

The control of the frequency of periodic variations of the conductivity of the semiconductor structure by an external effect (magnetic field, mechanical force, optical radiation, thermal effect) makes it possible to determine the magnitude of the external effect by measuring the frequency of these variations. In this case, since the data signal has a frequency-pulse form, the noise immunity and accuracy of measurement are improved and interface with a computer is simplified (no analog-to-digital converter is required).

The use of at least two types of external effects, one of which results in periodic variation of the conductivity in the current filament zone and the other of which controls the frequency of this variation, helps considerably reduce the threshold value of the external effects causing the periodic variation of the conductivity and widen the range of measurement.

Furthermore, the object of the invention is attained by providing a sensing element based on a semiconductor structure made of a material doped with a mixture of one type of conductivity in which a p-n junction is produced by introducing an impurity of the opposite type of conductivity; the impurity of the first type of conductivity is compensated by introducing a third impurity producing high power levels in the structure, which comprises contacts connected to the p-zone and to the n-zone for connection to a power supply source and for take-off of the output signal; according to the invention, the sensing element is based on such a semiconductor structure in which the concentration of impurities is in such a ratio that the amount of carriers produced by the impurity of the first type of conductivity compensated by the third impurity is essentially equal to the amount of carriers produced by the impurity of the second type of conductivity.

The object of the invention is also attained by providing a sensing element based on a semiconductor structure made of a material doped with a mixture of one type of conductivity in which a p-n junction is produced by introducing an impurity of the opposite type of conductivity; the impurity of the first type of conductivity is compensated by introducing a third impurity producing high power levels in the semiconductor structure, which comprises contacts connected to the p-zone and to the n-zone for connection to a power supply source and for take-off of the output signal; according to the invention, the sensing element is based on such a semiconductor structure in which the concentration of impurities is in such a ratio that the amount of carriers produced by the impurity of the first type of conductivity exceeds by at least one order the amount of carriers produced by the impurity of the second type of conductivity.

Manufacture of the sensing elements based on semiconductor structures in which the concentrations of impurities is in such a ratio that the amount of carriers produced by the impurity of the first type of conductivity is compensated by the third impurity is essentially equal to or exceeds by at least one order the amount of carriers produced by the impurity of the second type of conductivity makes it possible to obtain a frequency-pulse output signal of a high amplitude and to control the frequency of this signal by external signals.

The output signal frequency is determined by the magnitude of an external effect and can easily be measured without preliminary processing of the signal thus providing simple realization of converters of various properties based on such sensing elements, their high accuracy and noise immunity.

BRIEF DESCRIPTION OF THE DRAWINGS

The invention is further described by way of example with reference to the accompanying drawings, in which.

DETAILED DESCRIPTION OF PREFERRED EMBODIMENTS OF THE INVENTION

According to the invention, the semiconductor structure is made of a material doped with an impurity of one type of conductivity. Then an impurity of the opposite type of conductivity is added to the structure and a p-n junction is produced therein. The impurity of the first type of conductivity is compensated by adding a third impurity producing high power levels in the structure. The concentrations of the impurities are in such a ratio that the amount of carriers produced by the impurity of the first type of conductivity compensated by the third impurity is essentially equal to or exceeds by at least one order the amount of carriers produced by the impurity of the second type of conductivity.

Let us consider the method for controlling the conductivity of the semiconductor structure, in which the amount of carriers produced by the impurity of the first type of conductivity compensated by the third impurity is essentially equal to the amount of carriers produced by the impurity of the second type of conductivity. In this case, in the process of forming a current filament in the structure, the value of current is set in a range, within which a periodic variation of the conductivity in the zone of the current filament occurs in the structure. This leads to a change of the conductivity of the whole structure. In this case, a train of pulses is produced at the output of the semiconductor structure.

Let us consider a method for controlling the conductivity of a semiconductor structure in which periodic variation of the conductivity has taken place. Applied to such a structure is at least one external effect to control the frequency of variation of the conductivity and, therefore, the pulse repetition frequency at the semiconductor structure output.

Let us consider the method for controlling the conductivity of the semiconductor structure, in which the amount of carriers produced by the impurity of the first type of conductivity compensated by the third impurity exceeds by at least one order the amount of carriers produced by the impurity of the second type of conductivity. In this case, an external effect is applied to the semiconductor structure while the current is set in such a range where the application of the external effect results in periodic variation of the conductivity in the current filament zone. (In the absence of external effects, no periodic variation of the conductivity occurs in such a structure). In so doing, at the output of the semiconductor structure there is produced a train of pulses whose repetition frequency depends on the magnitude of the external effect. The current range, in which a periodic variation of conductivity in the current filament zone takes place in such structures, is selected depending on the concentrations of all types of impurities, geometric size and design parameters of the structure.

Figure 1:
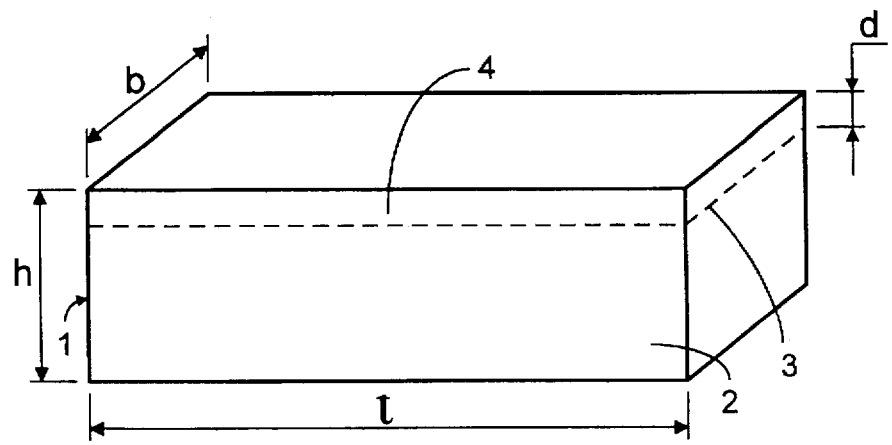
FIG. 1 shows a semiconductor structure, according to the invention.

Let us consider the physical processes occurring in the specific semiconductor structure of FIG. 1.

The semiconductor structure 1 is made of silicon doped with phosphorus. The phosphorus in the silicon is a donor impurity and creates an n-type conductivity (n-zone 2). The basic carriers in the n-zone 2 of structure 1 are electrons whose concentration is determined by the concentration $N_P$ of the phosphorus impurity. To create a p-n junction 3 having a depth d, aluminum is added to the structure 1. The aluminum in the silicon is an acceptor impurity and creates p-type conductivity (p-zone 4). The basic carriers in the p-zone 4 of the structure 1 are holes whose concentration is determined by the concentration $N_{Al}$ of the aluminum. The phosphorus impurity is totally compensated by a third impurity of gold with a concentration $N_{Au}$, in which case the electrons come to the high power levels of the gold and their concentration in the n-zone 2 decreases practically to a value of the natural concentration of carriers in the silicon.

The dimensions of the structure 1: length l, width b, height (thickness) h.

In the initial state at a temperature differing from that of absolute zero we may assume that the concentration of the basic carriers—holes in the p-zone 4 exceeds considerably the concentration of the basic carriers—electrons in the n-zone 2 since the electrons are mainly located on high power levels of the gold. The resistance of the structure 1 is determined mainly by the resistance of the compensated n-zone 2 whose conductivity is close to the natural value.

Figure 2:
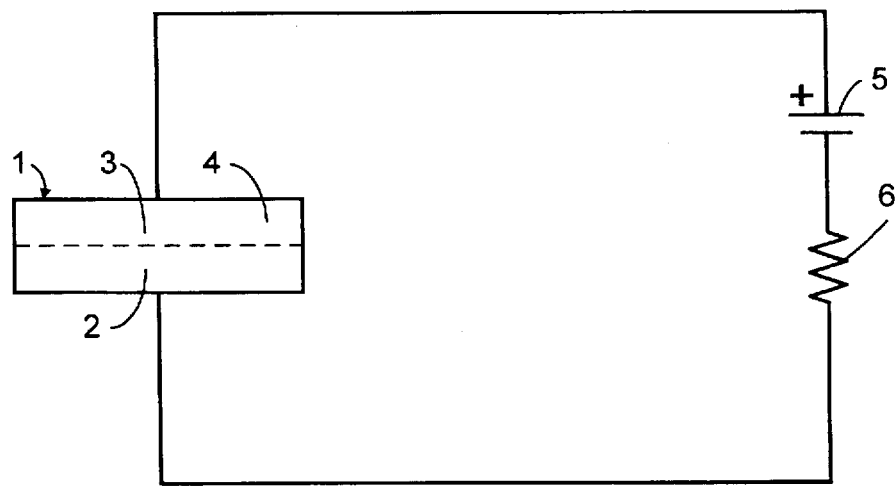
FIG. 2 is a schematic diagram of connection of the semiconductor structure.

Let us consider the current-voltage characteristic of the structure 1 when the p-n junction 3 is switched on in the forward direction (the p-zone 4 is connected to the positive terminal of the d-c power supply source 5 (FIG. 2).

The structure 1 is connected to the d-c power supply source 5 through a load resistor 6 which is used for limiting the current and taking off the output signal.

At the initial portion of the current-voltage characteristic (FIG. 3, section OA) the resistance of the structure 1 is high and the current flowing through the structure is low. An increase of the power supply voltage results in a monotonic increase of the current. The voltage applied to the structure 1 (FIG. 2) drops mainly across the high-resistance n-zone 2. At a certain moment of time the voltage attains a critical value $U_c$ (FIG. 3) at which the intensity of the electric field in the structure 1 increases to a value corresponding to the energy of activation of current carriers (electrons) located at the levels of the compensating impurity. Owing to the fact that in the structure 1 (FIG. 2), due to nonuniform distribution of doping impurities, defects and dislocations, there always exist sections, in which the power heating of the current carriers is obtained at lower values than $U_c$ (FIG. 3) than in the remaining volume, and a local "breakdown" of the structure 1 occurs (FIG. 2). In other words, a section appears in which the current carrier at the high power levels of compensation transfer to the conductivity zone. In this case, the conductivity of this section increases drastically. A process of forming a current flow or filament starts. The equilibrium state in the structure 1 is disturbed, an electron concentration gradient arises, which is eliminated by a flow of holes. Further development of the process is determined by the ratio between the impurities in the structure 1, and here three cases are possible.

1. If the amount of carriers (electrons) produced by introducing the phosphorus impurity and compensated by the gold impurity (during the "breakdown" the electrons in the current filament forming zone are released from the high levels of gold) is less than the amount of carriers (holes) produced by the aluminium impurity, at the $U_c$ voltage on the structure 1, the electrons coming from the gold levels rapidly recombine with the holes. No current filament appears.

Figure 3:
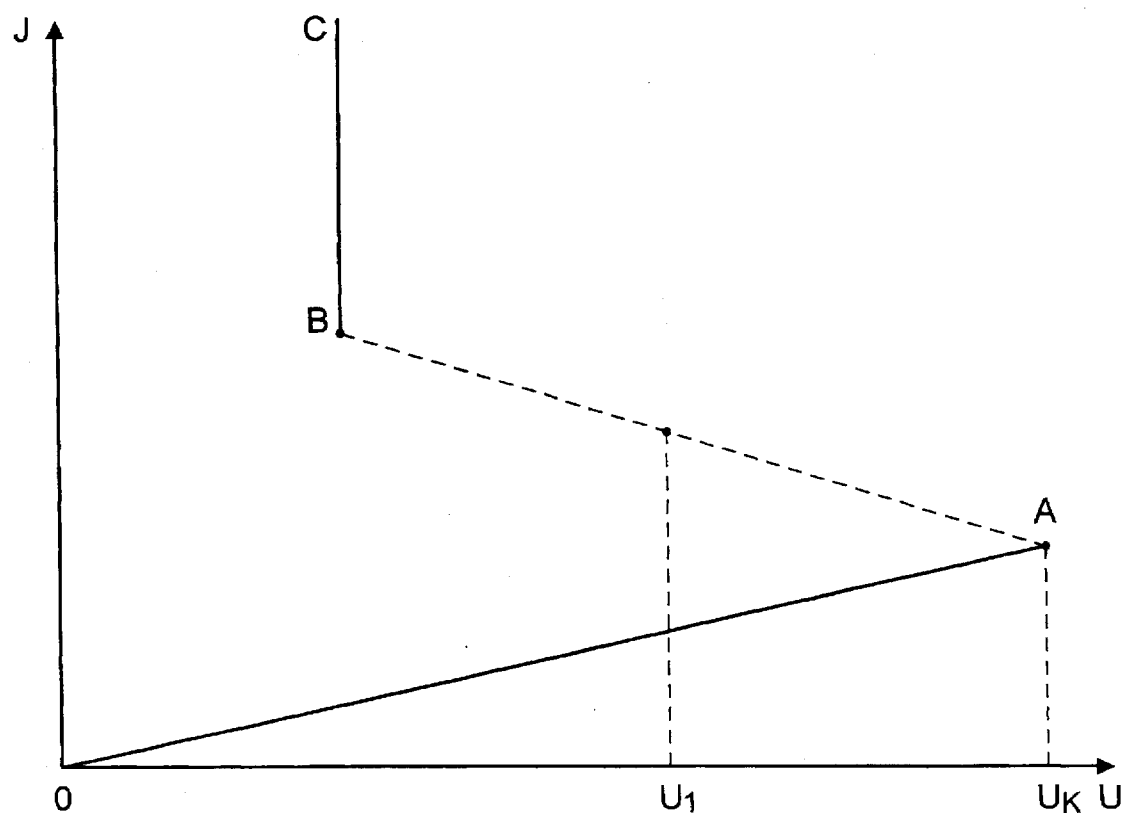
FIG. 3 graphically illustrates a current-voltage characteristic of semiconductor structures.

2. If, according to the invention, the amount of carriers produced by introducing the phosphorus impurity and compensated by the gold impurity is essentially equal to the amount of carriers produced by the aluminum impurity, on reaching the voltage $U_c$ on the structure 1, the process of forming the current filament started in the structure 1 continues. When this process is over, the current flow through the structure 1 increases and the voltage across the structure 1 drops (FIG. 3, section BC). In this case, the current density is different through the cross-sectional area of the structure 1 (FIG. 2): in the current filament zone it is much higher than in the other areas. The holes coming to the boundaries of the filament recombine with the current carriers (electrons) in the current filament.

Further development of the process is determined by the magnitude of the filament current which depends on the resistance of the load resistor 6 (FIG. 2), the power supply voltage, and the geometric dimensions and design parameters of the structure 1. The lower the resistance of the load resistor 6 and the higher the power supply voltage, the higher the filament current. The higher the concentration of the impurities, the higher the current density of the filament. The filament diameter and, therefore, the current increases with the height h. Thus, depending on the filament current, i.e. on the current density therein and its diameter, the process of recombination at the filament boundary results in the following.

In some range of the current which slightly differs from the current flowing through the structure at a voltage $U_c$, the amount of holes near the filament boundary and, essentially, equal to the amount of electrons is sufficient for origination of a filament destruction process. The filament current drops and the voltage across the structure 1 increases. When the voltage across the structure 1 increases to a value $U_f$ (FIG. 3) (the electric field intensity increases correspondingly), the recombinated electrons are again activated by the field, a new process of shock ionization starts and the current filament widens to the initial value. Therefore, in the semiconductor structure 1 (FIGS. 1, 2) with the above ratio of impurities in a preset range of currents, when a definite value of voltage $U_c$ is reached (FIG. 3), there arises a periodic variation of the conductivity in the current filament zone. When the current in the preset range increases, the time of destruction of the current filament also increases and, therefore, the frequency of variation of the conductivity of the semiconductor structure 1 (FIG. 2). With further increases of the current (above the preset range for a specific sample), the amount of holes coming to the filament boundaries is insufficient for destruction of the current filament and no periodic variation of the conductivity of the semiconductor structure 1 occurs, i.e. a stable current filament is formed.

3. If the amount of carriers (electrons) produced by introducing the gold impurity is higher than the amount of carriers (holes) produced by the aluminum impurity, this quantity of holes is insufficient for destruction of the current filament and, in this case, in the structure 1 (FIG. 2) there is formed a current filament which is stable when not acted on by external effects.

Let us consider the structure 1 (FIG. 4) in which periodic variations of the conductivity in the current filament zone 7 have appeared. When a magnetic field oriented normally to the current filament 7 is applied to this structure 1, a Lorentz force $F_L$ acts on the current carriers (electrons and holes) in and outside the filament 7. This force causes the carriers to deviate from the initial direction of motion. In this case, since the mobility of the electrons is higher than that of the holes, the former deviate by a greater distance. This disturbs the balance between the holes and electrons in the zone of the filament 7, the amount of holes increases and the filament 7 is destroyed faster.

The resistance of the structure 1 increases, the voltage across it also increases. When the voltage reaches the value $U_I$ (FIG. 3), a regular process of activation of the electrons returned to the high power levels of the gold occurs and the process is repeated. Thus, the applied magnetic field increases the rate of destruction of the current filament 7 (FIG. 4) thereby increasing the frequency of variation of the conductivity of the semiconductor structure 1. At the output of the structure 1 a frequency-pulse signal is produced whose repetition frequency is directly proportional to the value of the magnetic field.

If an external mechanical force P is applied, in the region of localization of the current filament 7, to the structure 1 (FIG. 5) whose conductivity has been changed, the power zones will be distorted. The energies of activation of the high power level gold impurity in the center of the current filament 7 and at its boundaries become different. At the center of the current filament 7 the activation energy decreases and at the boundaries it increases. As a result, a portion of free electrons at the boundary of the filament 7 "settle" on the gold levels. The recombination rate also changes. Therefore, in this case the frequency of variation of the conductivity of the structure 1 differs from the initial value and at the output of the structure 1 the signal frequency will be determined by the values of the external mechanical force P.

Figure 6:
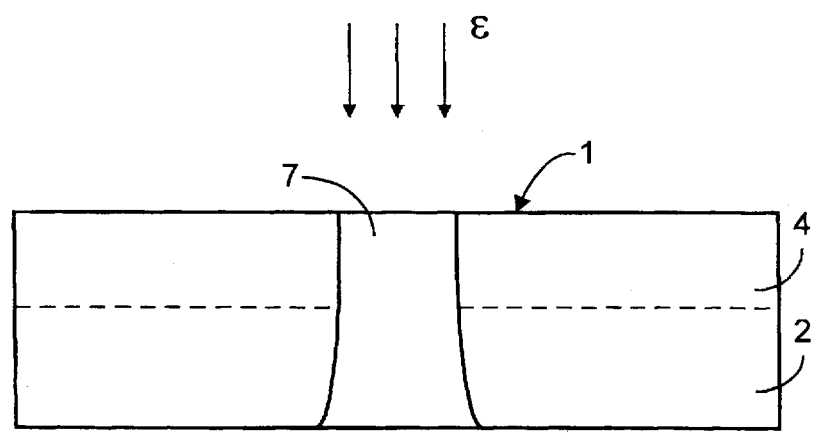
FIG. 6 shows the direction of action of optical radiation on the semiconductor structure.

If the structure 1 subjected to periodic variation of the conductivity in the current filament zone is acted on by an optical radiation (external effect) (FIG. 6) directed to the area of localization of the current filament 7, the concentration of the carriers in this region will be changed. In so doing, the rate of destruction of the current filament 7 and the rate of variation of the conductivity change, as well as the frequency of the output signal in proportion to the radiation intensity.

If the structure 1 subjected to periodic variation of the conductivity in the filament region is heated (external effect), this increases the energy of both free carriers and those disposed on the impurity levels and in the valence zone. In this case, a portion of electrons occupying the high power levels of the gold, outside the current filament, transfer to the conductivity zone and increases the current in the filament (the filament is widened). The greater the heating, the wider the filament. The time of the recombination process at the filament boundaries increases. The rate of change of the conductivity and, therefore, the output signal frequency decrease in proportion to the magnitude of the heating.

Therefore, if in the above-described structure 1 the concentrations of the impurities are selected in the range set forth, the number of carriers produced by the phosphorus impurity and compensated by the gold impurity will be essentially equal to the number of carriers produced by the aluminum impurity, and a stably oscillating current filament 7 originates in this structure, the conductivity of the filament 7 changing periodically. The frequency of change of conductivity can be controlled by applying at least one external force to the structure, such as a magnetic field, a mechanical force, optical radiation, and heat.

This structure 1 is used to realize sensing elements which are connected to the d-c power supply source 5 (FIG. 2) through load resistor 6 and which are in contact with the p-zone 4 and n-zone 2 of the semiconductor structure 1. All processes occurring in such a sensing element and the principle of its operation are identical to the processes and operating principle of the semiconductor structure 1 described above.

Figure 4:
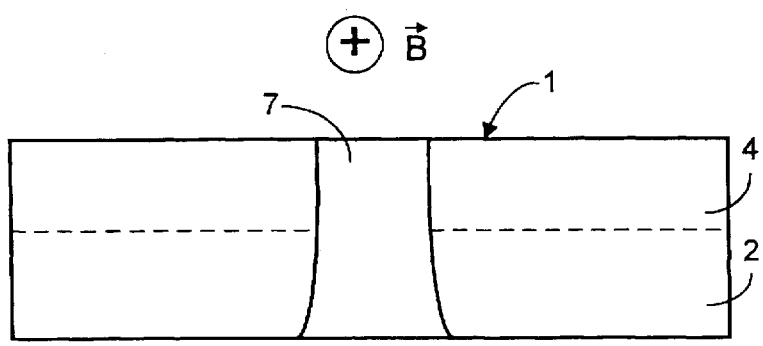
FIG. 4 shows the direction of action of a magnetic field on the semiconductor structure.

Let us consider a structure 1 in which the amount of carriers produced by a phosphorus impurity and compensated by the gold impurity exceeds the amount of carriers (by not more than one order) produced by an aluminum impurity. As mentioned above, in such a structure 1, to which the voltage $U_c$ is applied, a stable current filament 7 is originated (FIG. 4).

When a magnetic field oriented normally to the current filament 7 is applied to the structure 1, like in the previously discussed embodiment, the current carriers are deviated by the magnetic field from their initial drift direction. In this case, the stronger the magnetic field, the higher the deviation of the carriers. The recombination process in the current filament 7 increases. If the current of the filament 7 which, as mentioned above, depends on the resistance of the load resistor 6 (FIG. 2), power supply voltage, concentration of all types of impurities, geometric size and design parameters of the structure 1, is in the range, where at the given value of magnetic field $B_f$, the amount of holes coming to the current filament 7 (FIG. 4) becomes equal to the number of electrons therein (i.e. the conditions of equal amounts of carriers are produced), the current filament 7 starts being destroyed and a process originates similar to that occurring in the above-described structure 1. In other words, the magnetic field causes periodic variation of the conductivity in the zone of the current filament 7 of the semiconductor structure 1 resulting in a periodic change of its conductivity and appearance at the output of a frequency-pulse signal whose frequency is proportional to the magnetic field intensity. The magnetic field intensity $B_f$ associated with a periodic variation of the conductivity in the zone of the current filament 7 depends on the extent the amount of electrons activated from the high power levels of gold exceeds the amount of holes taking part in the recombination and on the current of the filament 7. The greater the number of electrons, the higher the magnetic field intensity $B_f$. However, if the amount of electrons exceeds that of holes by more than one order, the action of the magnetic field will be insufficient for realization in the structure 1 of a condition of equality of the amount of carriers and no periodic variation of the conductivity in the zone of the current filament 7 takes place. An increase of the current above the specific range established for the given structure 1 will lead to the same result.

Figure 5:
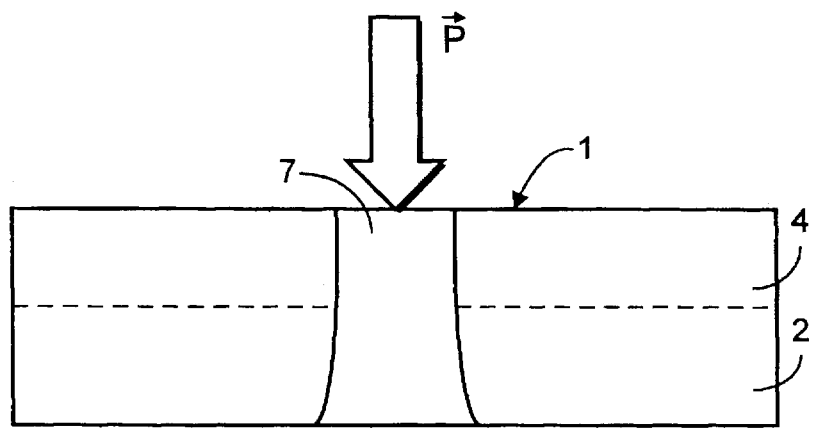
FIG. 5 shows the direction of action of a mechanical force on the semiconductor structure.

If the structure 1 is acted upon by a mechanical force (external effect) applied at the legion of localization of the current filament 7, as shown in FIG. 5, while the current is maintained in the above-defined range, the distortion of the energy zones lead to the fact that the energies of activation of the high power gold impurity in the center of the current filament 7 and at its boundaries are different. The activation energy is decreased in the center of the current filament 7 and is increased at its boundaries. As a result, some free electrons at the boundaries of the filament 7 "settle" on the gold levels.

The greater the mechanical force, the greater the amount of such electrons. If the mechanical force has a magnitude, at which the amount of electrons becomes equal to that of the holes, the conductivity decreases near the boundaries of the current filament 7 and the conductivity oscillates in the zone of the current filament 7 of the structure 1 in a way similar to that described above. The frequency of oscillation and, therefore, the frequency of the output signal is proportional to the magnitude of the applied mechanical force.

Let us consider still another version of application of an external effect to such a structure, this action being optical radiation. The optical radiation acts on the semiconductor structure so that it is directed to the region of localization of the current filament (FIG. 6) whose intensity is sufficient for transferring the electrons from the valence zone to the high power levels of gold thereby increasing the concentration of holes in the current filament zone. When the amount of these holes is equal to the amount of electrons, i.e. the carriers of both types are essentially equal in amount, periodic variations of the conductivity in the current filament zone take place in the structure 1. The higher the intensity of the optical radiation, the faster the current filament 7 is destroyed and the higher the frequency of the periodic variation of its conductivity.

Therefore, if in the silicon structure 1 the amount of electrons produced by the phosphorus impurity compensated by the gold impurity exceeds by not more than one order the amount of holes produced by the aluminum impurity, a periodic variation of the conductivity in the zone of the current filament 7 takes place in such a structure 1 under the external effect whose value exceeds the threshold value. Formed at the output of such a structure 1, is a frequency-pulse signal whose frequency is proportional to the external effect. The threshold value of the external effect increases as the difference between the reduced amounts of carriers increases.

Essential reduction of the threshold value can be attained by applying at least two types of signals to the structure 1. For example, a magnetic field is used to generate periodic variations of the conductivity in the zone of the current filament 7, while the external force or optical radiation is used to control their frequency. Other combinations of external effects are possible.

Such a semiconductor structure 1 is used as a basis for making sensing elements which are connected to the d-c power supply source 5 (FIG. 2) through load resistor 6 by means of contacts connected to the p-zone 4 and n-zone 2 of the structure 1. All processes occurring in such a sensing element and the principle of its operation are similar to the processes and principle of operation of the semiconductor structure 1 described above.

Let us discuss some specific embodiments of the sensing elements based on the semiconductor structures, which are manufactured using standard technology of semiconductor devices.

I. The sensing element is based on a semiconductor structure 1, in which the concentrations of impurities are in such a ratio that the amount of carriers produced by an impurity of the first type of conductivity compensated by the third impurity is essentially equal to the amount of carriers produced by an impurity of the second type of conductivity.

EXAMPLE 1

The starting material is silicon, the impurity of the first type of conductivity is phosphorus with a concentration $N_p$ equal to $10^{13}$ cm$^{-3}$; the impurity of the second type of conductivity is aluminum with a concentration $N_{Al}$ equal to $10^{14}$ cm$^{-3}$; the third impurity is gold with a concentration $N_{Au}$ equal to $10^{13}$ cm$^{-3}$. The contacts to the p-zone 4 and to the n-zone 2 are ohmic.

The sensing element dimensions;

l=7 mm; b=1.5 mm; h=0.33 mm; d=0.03 mm.

The critical voltage $U_c \approx 15$ V.

The range ΔJ of the current J providing periodic variation of the conductivity is 1.7 to 2.2 mA. In this case, the range Δf of the frequency f of the output signal is 1.5–5.0 kHz. The duration τ of the leading edge of the pulse is of the order of 7 μs. Under the effect of the optical radiation directed to the zone of the current filament 7 the frequency f of the output signal can reach a value of 50 kHz.

EXAMPLE 2

The starting material and the concentrations of the impurities are similar to the Example 1.

The sensing element dimensions:

l=7 mm; b=1.5 mm; h=0.28 mm; d=0.025 mm.

In this case $U_c \approx 7$ V; ΔJ is 1.4 to 2.0 mA. Δf is 2–7.5 kHz, while τ≈5 μs.

Under the effect of the optical radiation directed to the zone of the current filament 7, the frequency f of the output signal can reach a value of 63 kHz.

EXAMPLE 3

The starting material is silicon, the impurity of the first type of conductivity is phosphorus with a concentration $N_p$ equal to $10^{13}$ cm$^{-3}$; the impurity of the second type of conductivity is aluminum with a concentration $N_{Al}$ equal to $10^{14}$ cm$^{-3}$; the third impurity is zinc with a concentration $N_{Zn}$ equal to $2.10^{13}$ cm$^{-3}$.

The contacts to the p-zone 4 and to the n-zone 2 are ohmic.

The sensing element dimensions:

l=7 mm: b=1.5 mm; h=0.33 mm; d=0.03 mm.

The critical voltage $U_c \approx 16$ V.

In this case $U_c \approx 16$ V;

ΔJ is 2.1 to 2.6 mA;

Δf is 1.1–4.8 kHz;

τ≈9 μs.

Under the effect of the optical radiation directed to the zone of the current filament 7 the frequency f of the output signal can reach a value of 43 kHz.

II. The sensing element is based on semiconductor structure 1 in which the concentration of impurities is in such a ratio that the amount of carriers produced by the impurity of the first type of conductivity compensated by the third impurity exceeds by not more than one order the amount of impurities produced by the impurity of the second type of conductivity.

EXAMPLE 4

The starting material is silicon, the impurity of the first type of conductivity is phosphorus with a concentration $N_p$ equal to $10^{13}$ cm$^{-3}$; the impurity of the second type of conductivity is aluminum with a concentration $N_{Al}$ equal to $5.10^{13}$ cm$^{-3}$; the third impurity is gold with a concentration $N_{Au}$ equal to $10^{13}$ cm$^{-3}$.

The sensing element dimensions:

l=10 mm; b=1.5 mm; h=0.3 mm; d=0.25 mm.

In this case, $U_c \approx 10$ V.

The range ΔJ of the current providing periodic variation of the conductivity of the structure 1 is 1.5 to 6 mA, τ≈8 μs.

Under the effect of the optical radiation directed to the zone of the current filament 7 a train of pulses is produced at the output of the structure 1. The pulse repetition frequency f in the magnetic field range of 100 to 600 mT is (0.5–20) kHz.

EXAMPLE 5

The starting material and the concentrations of the impurities are similar to Example 4.

The sensing element dimensions:

l=10 mm; b=1.5 mm; h=0.4 mm; d=0.04 mm.

In this case Oc≈25 V; ΔJ is 2.1 to 8 mA; τ≈13 μs.

Under the effect of the optical radiation directed to the zone of the current filament 7 a train of pulses is produced at the output of the structure 1. The pulse repetition frequency f in the magnetic field range of 100 to 600 mT is (0.5–15) kHz.

From the above examples it is clear that by varying the design and technological parameters of the structures 1, one can control in rather a wide range the parameters and characteristics of the sensing elements and other semiconductor devices based on such structures. In so doing, at the output of such elements and devices there is generated a stable frequency-pulse output signal whose shape and amplitude provide simple processing of this signal at a subsequent stage.

The above-described semiconductor structures may be used as sensing elements of transducers of various physical quantities with a frequency-pulse output signal, self-excited oscillators, threshold devices, converters of d.c. voltage into frequency, etc. When the structures are used as sensing elements of transducers, an external force is applied to the structure 1 and the magnitude of this force is determined from the output signal frequency. In this case, if in the absence of external effects, the current filament is in a stable state, i.e. no periodic changes of the conductivity in this current filament occurs, the minimum value of the external effect must be greater than the threshold value to provide periodic variation of the conductivity. This threshold value increases as the amount of carriers produced by the impurity of the first type of conductivity compensated by the third impurity exceeds the amount of carriers produced by the impurity of the second type of conductivity. In this case, a variation of the current filament conductivity can be the result of one force while the frequency of this variation can be controlled by another force (the forces may be of the same type).

Therefore, the range of measurements based on the sensing elements can be varied to a considerable extent. The minimum value of the external effect is determined by the minimum rate of change of the output signal which can be recorded by the measuring instruments at the subsequent stage of the system. The maximum value of the external effect is determined by the amount of carriers in the current filament and increases with an increase of this amount.

The amplitude of the output frequency-pulse signal of such sensing elements is equal to several volts while the frequency is in the range of a few hundred Hz to a few hundred kHz.

The frequency-pulse shape and a high amplitude of the output signal provide high noise immunity and accuracy of measurements, need no noise protection devices, or signal amplifiers and simplify interfacing with a computer (no analog-to-digital converter is required).

The semiconductor structures, in which periodic variation of the conductivity in the current filament zone appear without an external effect can be used as a self-excited oscillator. In this case, the initial frequency f of oscillations is determined by the amount of carriers in the current filament and can change with a change in the power supply voltage.

The semiconductor devices, in which the periodic variation of the conductivity of the current filament is a result of an external effect can be used as threshold devices. In this case, depending on the amount of carriers in the p and n zones and the power supply voltage, an action of an external signal above a preset threshold level, lead to either a current fluctuation related to a periodic change of the conductivity of the current filament or to a sharp drop of the current due to total destruction of the current filament.

When the above described structures are used for converters for transforming d.c. voltage to a frequency f, first, there is effected conversion of the d.c. voltage into a permanent magnetic field (by means of an electromagnetic coil) which is then converted to a voltage frequency.

A simple method of obtaining a frequency-pulse signal at the output of such devices is a significant advantage. The absence of additional elements for amplification, shaping and processing of the signal simplifies the design of instruments based on such devices, reduces their size, weight and cost while enhancing their operational reliability.

INDUSTRIAL APPLICABILITY

The invention can find application in measuring instruments, robot engineering, and adjustable automatic production lines. This invention may be used to develop semiconductor converters of physical quantities with a frequency-pulse output signal, self-excited oscillators, threshold devices, d.c. voltage-to-frequency converters, and other semiconductor devices providing simple shaping of a frequency-pulse output signal of a high amplitude with high operational reliability.

What is claimed is:

1. A semiconductor device comprising a body of semiconductor material including first and second adjacent regions having an interface therebetween, said body being doped with a first impurity of a concentration providing said first region with an amount of first charge carriers of a first type of conductivity, the second region being doped with a second impurity of a concentration providing said second region with an amount of second charge carriers of a type of conductivity opposite said first type of conductivity, the concentrations of said first and second impurities being such that the amount of said first charge carriers in said first region is in the range of around 1 to 10 times the amount of all said second charge carriers in said second region, said body being doped with a third impurity of a concentration providing, trapping, in the absence of a current filament, at high energy levels of said third impurity, all of the first charge carriers produced by said first impurity.

2. A method of operating a semiconductor device having an output, said method comprising the steps of:

providing a body of semiconductor material including first and second adjacent regions having an interface therebetween, said body being doped with a first impurity of a concentration providing said first region with an amount of first charge carriers of a first type of conductivity, the second region being doped with a second impurity of a concentration providing said second region with an amount of second charge carriers of a type of conductivity opposite said first type of conductivity, the concentrations of said first and second impurities being such that the amount of said first charge carriers in said first region is essentially equal to the amount of said second charge carriers in said second region, said body being doped with a third impurity of a concentration effective, in the absence of current filament, for trapping, at high energy levels of said third impurity, all of the first charge carriers produced by said first impurity, applying a d.c. voltage across said body for forward biasing the interface between said regions, said d.c. voltage being of a magnitude sufficient for releasing first charge carriers trapped by said third impurity in said first region and causing a filament of current to flow through a zone through said body, said filament of current being in a range of currents giving rise to a periodic variation of the conductivity of said zone and thereby generating a sequence of electrical pulses at a first frequency at the output of the device.

3. The method according to claim 2 comprising, after the step of applying said d.c. voltage across said body, a step of applying an external force to said body for varying the frequency of variation of the conductivity of said zone and a corresponding variation in the frequency of said electrical pulses, and measuring said frequency variation for determining the magnitude of said external force.

4. A semiconductor device according to claim 1, wherein said semiconductor material is silicon, said first impurity is phosphorous, said second impurity is aluminum, and said third impurity is gold.

5. The method according to claim 2 comprising, after the step of applying said d.c. voltage across said body, a step of applying an external effect to said body for varying the frequency of variation of the conductivity of said zone and generating a corresponding variation in the frequency of said electrical pulses.

6. The method according to claim 5, wherein said step of applying said external effect includes applying a magnetic field oriented normally to said current carrying zone.

7. The method according to claim 5, wherein said step of applying said external effect includes applying a mechanical force to said zone.

8. The method according to claim 5, wherein said step of applying said external effect includes heating said body.

9. A method of operating a semiconductor device having an output, said method comprising the steps of:

providing a body of semiconductor material including first and second adjacent regions having an interface therebetween, said body being doped with a first impurity of a concentration providing said first region with an amount of first charge carriers of a first type of conductivity, the second region being doped with a second impurity of a concentration providing said second region with an amount of second charge carriers of a type of conductivity opposite said first type of conductivity, the concentrations of said first and second impurities being such that the amount of said first charge carriers in said first region ranges in excess of one and up to around 10 times the amount of said second charge carriers in said second region, said body being doped with a third impurity of a concentration effective, in the absence of current filament, for trapping, at high energy levels of said third impurity, all the first charge carriers produced by said first impurity, applying a d.c. voltage across said body for forward biasing the interface between said regions, said d.c. voltage being of a magnitude sufficient for releasing first charge carriers trapped by said third impurity in said first region and causing a filament of current to flow through a zone through said body; and, applying an external effect to said body for giving rise to a periodic variation of the conductivity of said zone and thereby generating a sequence of electrical pulses at a first frequency at an output of the device in accordance with the magnitude of said external effect.

10. The method according to claim 9, wherein the step of applying an external effect to said body includes the step of varying the frequency of said pulses by varying the magnitude of said external effect.

11. The method according to claim 10, wherein the step of applying an external effect to said body includes applying said external effect by means of one of a magnetic field, a mechanical force, and optical radiation applied to said zone.

12. The method according to claim 9, wherein the step of applying an external effect to said body includes applying two effects selected from the group of effects consisting of a magnetic field, a mechanical force, and optical radiation.

13. The method according to claim 10, further including the step of measuring the frequency of said pulses for determining the magnitude of said external effect.

14. The method according to claim 12, wherein the step of applying an external effect to said body includes the steps of applying one of said effects at a preselected magnitude, varying the magnitude of the other of said two external effects, and measuring the frequency of said pulses for determining the magnitude of said other external effect.

15. A semiconductor device comprising a body of semiconductor material inclusive of first and second sections, and first, second, and third impurities; said first impurity being located in at least said first section at a concentration for providing first charge carriers of one type of conductivity, said second impurity being located in said second section and providing an interface between said sections, and said third impurity being located in at least said first section and of a concentration effective, in the absence of a current filament, for trapping said first charge carriers at high energy levels of said third impurity, said second impurity being capable of being compensated in part by said first impurity and said third impurity depending upon the presence of at least one of said first and third impurities in said second section, said second impurity being of a concentration such that, a portion in excess of the part which is compensated provides uncompensated second charge carriers of a type of conductivity which is opposite to that of the first charge carriers, the ratio of the amount of first charge carriers in said first region to the uncompensated second charge carriers in said second region being in the range from 1:1 to 10:1.

16. The semiconductor device according to claim 15, wherein said semiconductor material is silicon, said first impurity is phosphorus, said second impurity is aluminum, and said third impurity is gold.

17. A method of operating a semiconductor device comprising the steps of:

providing a body of semiconductor material inclusive of first and second sections, and first, second, and third impurities; said first impurity being located in at least said first section at a concentration for providing first charge carriers of one type of conductivity, said second impurity being located in said second section and providing an interface between said sections, and said third impurity being located in at least said first section and of a concentration effective, in the absence of a current filament, for trapping said first charge carriers at high energy levels of said third impurity, said second impurity being capable of being compensated in part by said first impurity and said third impurity depending upon the presence of at least one of said first and third impurities in said second section, said second impurity being of a concentration such that, a portion in excess of the part which is compensated provides uncompensated second charge carriers of a type of conductivity which is opposite to that of the first charge carriers, the amount of first charge carriers in said first region being essentially equal to the uncompensated second charge carriers in said second region, and, applying a d.c. voltage across said body, said d.c. voltage being of a magnitude sufficient for releasing first charge carriers trapped by said third impurity in said body and causing a filament of current to flow through a zone of said body, said filament of current being in a range of currents giving rise to a periodic variation of the conductivity of said zone to thereby generate a sequence of electrical pulses at a first frequency at an output of the device.

18. The method according to claim 17, wherein after the step of applying said d.c. voltage of a predetermined level across said first and second regions, applying an external force to said body for varying the frequency of variation of the conductivity of said current filament zone and a corresponding variation in the frequency of said electrical pulses, and measuring said frequency variation for determining the magnitude of said external force.

19. The method according to claim 17, wherein after the step of applying said d.c. voltage of a predetermined level across said first and second regions, applying an external effect to said body for varying the frequency of variation of the conductivity of said current filament zone and a corresponding variation in the frequency of said electrical pulses.

20. The method according to claim 19, wherein said step of applying said external effect includes applying a magnetic field oriented normally to said current filament zone.

21. The method according to claim 20, wherein said step of applying said external effect includes applying a mechanical force against said current filament zone.

22. The method according to claim 20, wherein said step of applying said external effect includes applying heat to said body.

* * * * *

UNITED STATES PATENT AND TRADEMARK OFFICE
CERTIFICATE OF CORRECTION

PATENT NO. : 5,742,092
DATED : April 21, 1998
INVENTOR(S) : Vladislav D. ZOTOV, et al.

It is certified that error appears in the above-indentified patent and that said Letters Patent is hereby corrected as shown below:

```
On title page, item 63, "filed as" should be
-- abandoned, which is a continuation of --
and "Nov. 29" should be -- Dec. 29 -- and item
30, "Dec. 29" should be -- Nov. 24 -- and "[WO]
WIPO PCT/SU89/00340" should be -- [SU] USSR
4759168 --.

On column 1, line 9, "filed as" should be -- now
abandoned which is a continuation of -- and line
10, "Nov." should be -- Dec. --.
```

Signed and Sealed this

First Day of September, 1998

Attest:

BRUCE LEHMAN

*Attesting Officer*     *Commissioner of Patents and Trademarks*